(12) United States Patent
Inanami et al.

(10) Patent No.: US 7,914,958 B2
(45) Date of Patent: Mar. 29, 2011

(54) SEMICONDUCTOR DEVICE MANUFACTURING METHOD

(75) Inventors: Ryoichi Inanami, Yokohama (JP);
Shinji Mikami, Kawasaki (JP);
Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/478,408

(22) Filed: Jun. 4, 2009

(65) Prior Publication Data

US 2009/0305152 A1 Dec. 10, 2009

(30) Foreign Application Priority Data

Jun. 9, 2008 (JP) ................................. 2008-150627

(51) Int. Cl.
*G03C 5/00* (2006.01)
*G03F 9/00* (2006.01)
*B29C 35/08* (2006.01)

(52) U.S. Cl. ............ 430/30; 430/22; 430/312; 430/322; 264/40.5; 264/494; 264/496

(58) Field of Classification Search .................... 430/22, 430/30, 312, 322; 264/40.5, 494, 496
See application file for complete search history.

(56) References Cited

U.S. PATENT DOCUMENTS

| 6,916,585 | B2 | 7/2005 | Sreenivasan et al. | |
| 7,115,525 | B2 * | 10/2006 | Abatchev et al. | 438/725 |
| 7,537,866 | B2 * | 5/2009 | King Liu | 430/5 |
| 7,560,201 | B2 * | 7/2009 | Liu | 430/5 |

FOREIGN PATENT DOCUMENTS

JP 2007-15375 1/2007

* cited by examiner

*Primary Examiner* — Christopher G Young
(74) *Attorney, Agent, or Firm* — Finnegan, Henderson, Farabow, Garrett & Dunner, L.L.P.

(57) ABSTRACT

A semiconductor device manufacturing method has forming a first resist pattern on the semiconductor substrate, and then, forming a first pattern on the semiconductor substrate by the use of the first resist pattern, and forming a second resist pattern on the semiconductor substrate by using an imprinter, and then, forming a second pattern on the semiconductor substrate by the use of the second resist pattern. The forming the first pattern, the first pattern smaller than a design pattern corresponding to the design data for forming a plurality of patterns on a semiconductor substrate being formed.

16 Claims, 4 Drawing Sheets

SEMICONDUCTOR DEVICE MANUFACTURING METHOD

CROSS-REFERENCE TO RELATED APPLICATION

This application is based upon and claims the benefit of priority from the prior Japanese Patent Application No. 2008-150627, filed on Jun. 9, 2008; the entire contents of which are incorporated herein by reference.

BACKGROUND OF THE INVENTION

1. Field of the Invention

The present invention relates to a semiconductor device manufacturing method and, more particularly, to a semiconductor device manufacturing method using an imprinter.

2. Related Art

In recent years, as one of resist pattern transferring methods has been known as an optical nano-imprinting. The optical nano-imprinting includes filling a space defined between a template having a shape of a resist pattern and a substrate to be transferred with an imprinted resin of a monomer; irradiating the template and the substrate to be transferred in contact or proximity with each other with light; and crosslinking the imprinted resin so as to transfer the resist pattern. It is unnecessary to interpose an optical projecting lens between the template and the substrate in the optical nano-imprinting, with an advantage that the pattern shape of the template can be transferred to the imprinted resin on the substrate in a one-to-one size.

In contrast, in manufacturing a semiconductor device, a stereoscopic circuit pattern is made by repeating optical nano-imprinting a plurality of times and processing a substrate to be transferred. Therefore, it is necessary to perform operation (hereinafter referred to as "alignment") for controlling the position, size, and shape of a resist pattern to be transferred by using the optical nano-imprinting in manufacturing the semiconductor device according to the position, size, and shape of a pattern formed already on a lower layer of the substrate to be transferred (hereinafter referred to as "a primary pattern"), and thus, forming the resist pattern in conformity with the primary pattern. In the alignment, differences in size and shape between the primary pattern and the template cause the degradation of the performance of the semiconductor device.

In the alignment for the optical nano-imprinting in the prior art, the template is deformed by applying force to the periphery thereof, thereby allowing the size and shape of a pattern formed on the template to conform to those of the primary pattern (see U.S. Pat. No. 6,916,585). At this time, there is manufactured a template which is enlarged under a magnification correctable by an imprinter with respect to the primary pattern. Therefore, in order to manufacture the template enlarged under such a magnification, the conventional alignment needs design data enlarged under the same magnification.

However, the magnification correctable by the imprinter is as very small a value as about several ppm to the maximum. Therefore, variations in position and size of the pattern in the design data enlarged under the magnification are smaller than a grid size of the design data made by a CAD or the like. Therefore, it is possible that the size of the pattern may be varied when the position of the pattern falls in positional coordinates which are large to some extent. As a result, a rounding error occurs in the size or position of the pattern.

An adverse influence of such a rounding error can be reduced by more reducing the grid size of the design data. However, a pattern writer for manufacturing a template cannot cope with a small addressing size enough to reduce the adverse influence of such a rounding error. In the same manner, a rounding error occurs also when the pattern writer writes or produces data for writing. Therefore, the resist pattern formed by the optical nano-imprinting using such a template undesirably includes large alignment error in imprinting. The larger the alignment error becomes, the lower the yield of the semiconductor device gets.

BRIEF SUMMARY OF THE INVENTION

According to an aspect of the present invention, there is provided a semiconductor device manufacturing method comprising:

forming a first resist pattern on the semiconductor substrate, and then, forming a first pattern on the semiconductor substrate by the use of the first resist pattern; and forming a second resist pattern on the semiconductor substrate by using an imprinter, and then, forming a second pattern on the semiconductor substrate by the use of the second resist pattern;

wherein upon forming the first pattern, the first pattern smaller than a design pattern corresponding to the design data for forming a plurality of patterns on a semiconductor substrate being formed.

DETAILED DESCRIPTION OF THE INVENTION

A detailed description will be given below of an embodiment of the present invention in reference to the attached drawings. Here, the embodiment of the present invention below is merely a mode carried out by the present invention, and therefore, does not limit the scope of the present invention.

First of all, explanation will be made on an embodiment of the present invention. The embodiment of the present invention exemplifies forming a pattern to be formed first (hereinafter referred to as "a first pattern") smaller than a pattern to be formed later (hereinafter referred to as "a second pattern").

Figure 1:
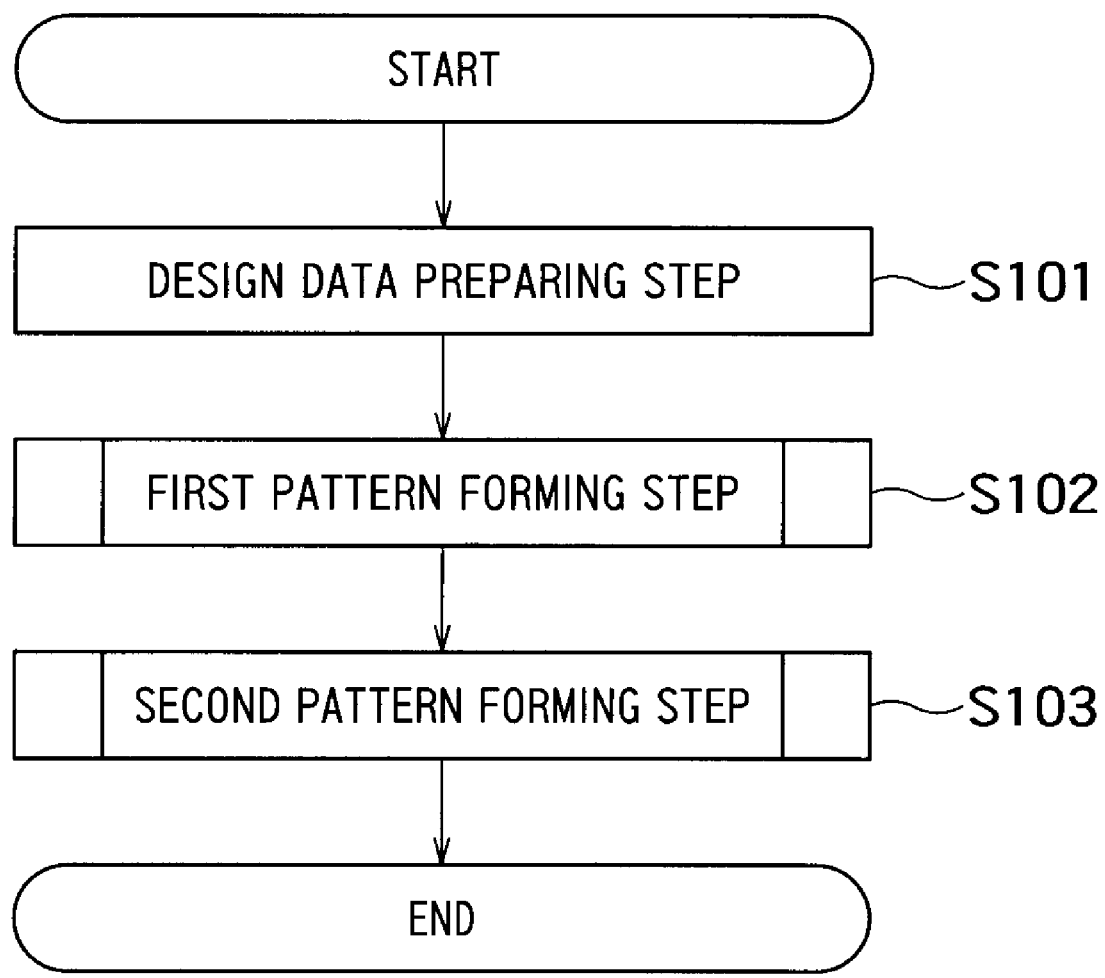
FIG. 1 is a flowchart illustrating a manufacturing process by a semiconductor device in the embodiment of the present invention.

FIG. 1 is a flowchart illustrating a manufacturing process by a semiconductor device in the embodiment of the present invention.

This manufacturing process includes a design data preparing step (S101), a first pattern forming step to be performed by using an exposing device or an imprinter (for example, an optical nanoimprinter) (S102), and a second pattern forming step to be performed by using the imprinter (for example, the optical nanoimprinter) (S103).

First of all, in the design data preparing step (S101), design data including first design data for use in the first pattern forming step (S102) and second design data for use in the second pattern forming step (S103) is prepared. The first and second design data are design data which correspond to patterns such designed that a semiconductor device to be manufactured can operate. The relationship in size between the patterns corresponding to the design data (hereinafter referred to as "a first design pattern" and "a second design pattern") corresponds to the dimensional relationship of patterns to be formed on a semiconductor substrate in a one-to-one manner.

Subsequently, in the first pattern forming step (S102), a first pattern having a size obtained by reducing the first design pattern included in the design data prepared in the design data preparing step (S100) is formed on the semiconductor substrate. Here, the first pattern is formed by using an exposing device, and it is formed prior to a second pattern which is formed by using an imprinter. For example, the first pattern is a pattern to be first formed in the manufacturing process (i.e., it is a pattern for forming a semiconductor well on the semiconductor substrate).

Figure 2:
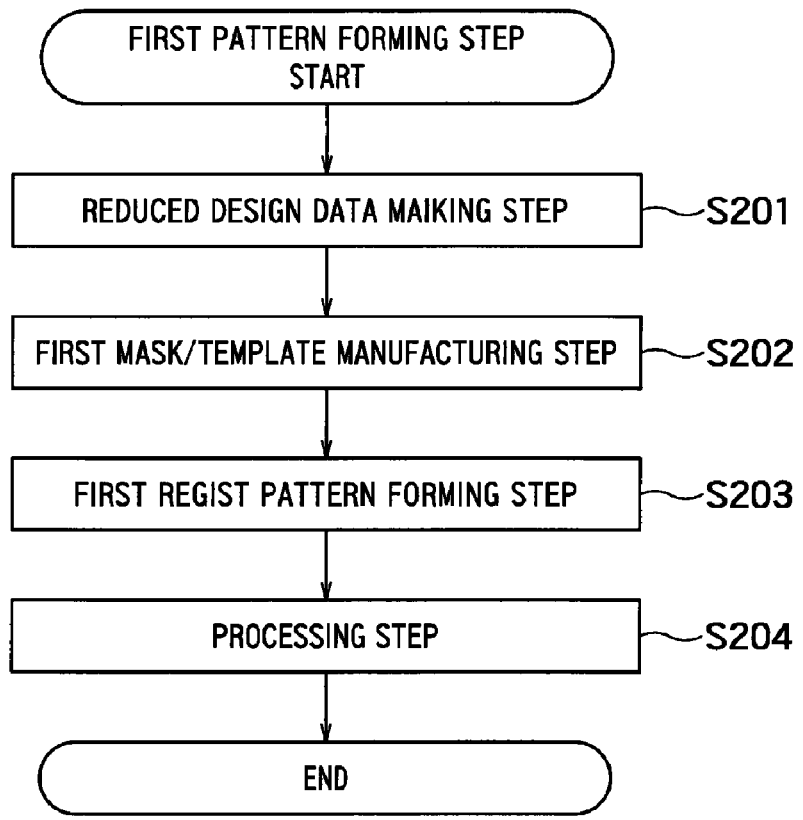
FIG. 2 is a flowchart illustrating the first pattern forming step (S102) illustrated in FIG. 1.

FIG. 2 is a flowchart illustrating the first pattern forming step (S102) illustrated in FIG. 1.

The first pattern forming step (S102) includes a reduced design data making step (S201), a first mask/template manufacturing step (S202), a first resist pattern forming step (S203), and a processing step (S204).

First of all, the reduced design data making step (S201) is carried out. In the reduced design data making step (S201), reduced design data is made by reducing the design data prepared in the design data preparing step (S101) illustrated in FIG. 1. At this time, a magnification of the reduction falls within a range of a magnification (e.g., ±several ppm) correctable by an imprinter used in the second pattern forming step (S103) illustrated in FIG. 1.

Subsequently, the first mask/template manufacturing step (S202) is carried out. In the first mask/template manufacturing step (S202), a mask or a template (hereinafter referred to as "a first mask or the like") for forming the first pattern is manufactured based on the reduced design data made in the reduced design data making step (S201) by using a pattern writer.

Subsequently, the first resist pattern forming step (S203) is carried out. In the first resist pattern forming step (S203), a resist pattern for forming the first pattern (hereinafter referred to as "a first resist pattern") is formed on the semiconductor substrate by the use of the first mask or the like manufactured in the first mask/template manufacturing step (S202).

Figure 3:
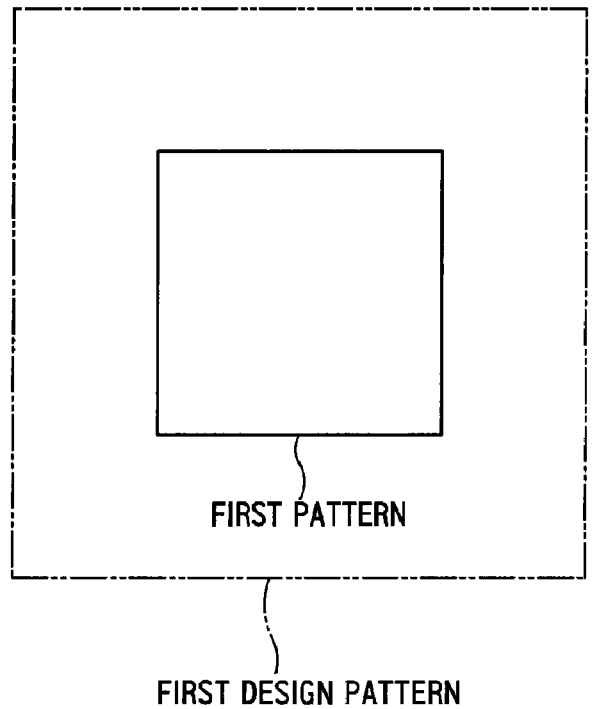
FIG. 3 is a diagrammatic illustration illustrating the relationship between the first pattern and the first design pattern.

Subsequently, a processing step (S204) is carried out. In the processing step (S204), the semiconductor substrate is processed via the first resist pattern formed in the first resist pattern forming step (S203). In this manner, the first pattern smaller than the first design pattern is formed on the semiconductor substrate, as shown in FIG. 3.

As shown in FIG. 1, after the first pattern forming step (S102), the second pattern forming step (S103) is carried out. In the second pattern forming step (S103), a second pattern having the same size as the first pattern formed previously is formed on the semiconductor substrate. The second pattern is formed by using the imprinter after the first pattern is formed by the exposing device.

Figure 4:
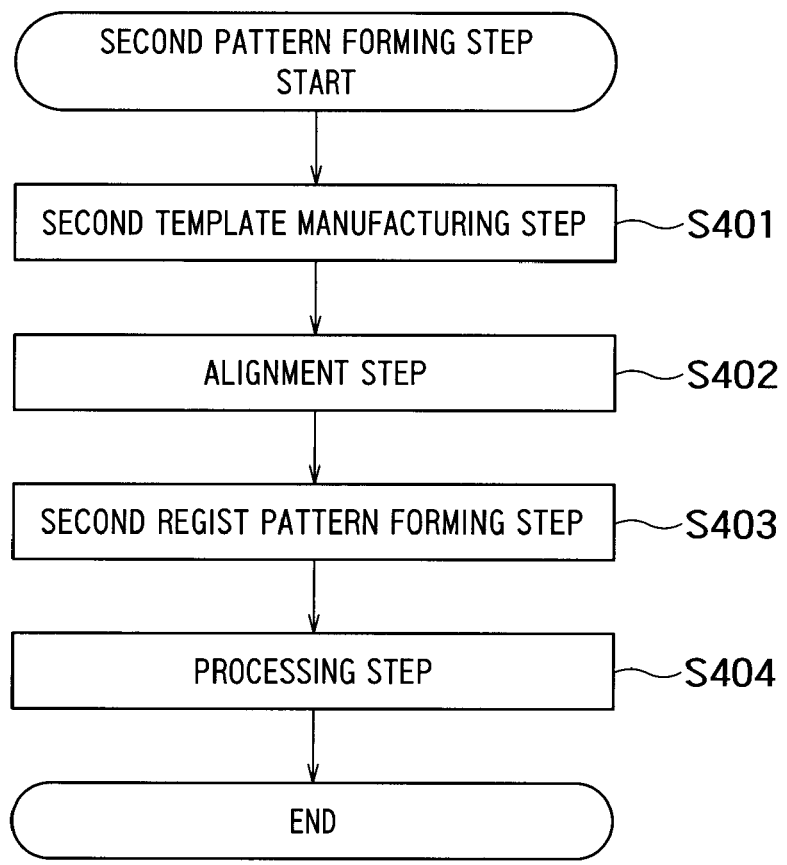
FIG. 4 is a flowchart illustrating the second pattern forming step (S103) illustrated in FIG. 1.

FIG. 4 is a flowchart illustrating the second pattern forming step (S103) illustrated in FIG. 1.

The second pattern forming step (S103) includes a second template manufacturing step (S401), an alignment step (S402), a second resist pattern forming step (S403), and a processing step (S404).

First of all, the second template manufacturing step (S401) is carried out. In the second template manufacturing step (S401), a second template for forming the second pattern is manufactured based on the design data prepared in the design data preparing step (S101) illustrated in FIG. 1 by the use of the pattern writer. The second template is adapted to form a pattern having substantially the same size as the first design pattern.

Subsequently, the alignment step (S402) is carried out. In the alignment step (S402), the size and shape of the second template are adjusted in such a manner that the size of a pattern corresponding to the second template manufactured in the second template manufacturing step (S401) becomes substantially the same as that of the first pattern.

Subsequently, the second resist pattern forming step (S403) is carried out. In the second resist pattern forming step (S403), another resist pattern for forming the second pattern (hereinafter referred to as "a second resist pattern") is formed on the semiconductor substrate by the use of the second template whose size and shape are adjusted in the alignment step (S402). The second resist pattern has substantially the same size as that of the first resist pattern.

Figure 5:
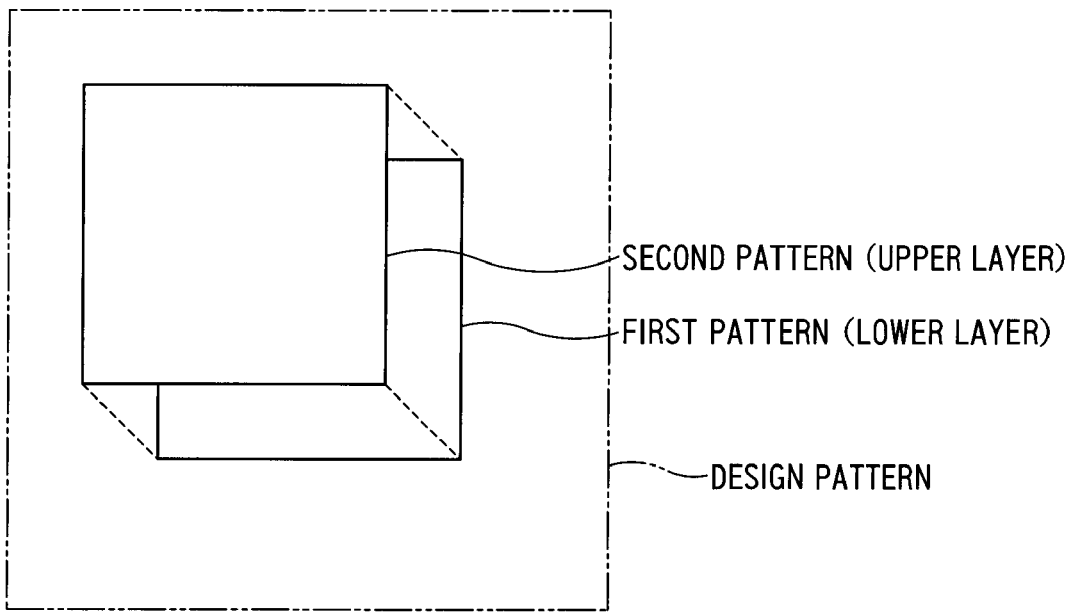
FIG. 5 is a diagrammatic illustration illustrating the relationship between the first and second pattern and the design pattern.

Subsequently, the processing step (S404) is carried out. In the processing step (S404), the semiconductor substrate is processed via the second resist pattern formed in the second resist pattern forming step (S403). In this manner, the first pattern serving as a lower pattern smaller than the first design pattern and the second pattern serving as an upper pattern are formed on the semiconductor substrate, as shown in FIG. 5. Incidentally, patterns to be formed after the second pattern are formed in the same manner as in the second pattern forming step (S103) illustrated in FIG. 1.

Alternatively, in the embodiment of the present invention, the second pattern may be formed on or in the first pattern.

In a first modification of the embodiment of the present invention, the first mask or the like may be reduced in the first mask/template manufacturing step (S202) in place of the reduction of the design data in the reduced design data making step (S201) illustrated in FIG. 2.

For example, after the first mask or the like is manufactured without any reduction based on the first design data in the first mask/template manufacturing step (S202), a reduced mask or a reduced template (hereinafter referred to as "a reduced mask or the like") is manufactured by reducing the first mask or the like manufactured in the first mask/template manufacturing step (S202) before the first resist pattern forming step (S203), and then, the first resist pattern may be formed by the use of the reduced mask or the like in the processing step (S204). At this time, the magnification of the reduction can be corrected by the imprinter used in the second pattern forming step (S103) illustrated in FIG. 1. In this case, the reduced design data making step (S201) is skipped.

Alternatively, in a second modification of the embodiment of the present invention, the first resist pattern reduced in the first resist pattern forming step (S203) illustrated in FIG. 2 may be formed in place of the reduction of the design data in the reduced design data making step (S201) illustrated in FIG. 2.

For example, in the first resist pattern forming step (S203), a resist film on the semiconductor substrate is exposed to light by the exposing device under a predetermined magnification of the reduction via the first mask corresponding to the first design data, and then, a resist pattern is formed by developing, and further, a film to be processed on the substrate is processed via the resist pattern as the mask, so that the first pattern smaller than the pattern corresponding to the first design data may be transferred onto the semiconductor substrate. At this time, the magnification of the reduction can be corrected by the imprinter to be used in the second pattern forming step (S103) illustrated in FIG. 1. In this case, the reduced design data making step (S201) is skipped.

Figure 6:
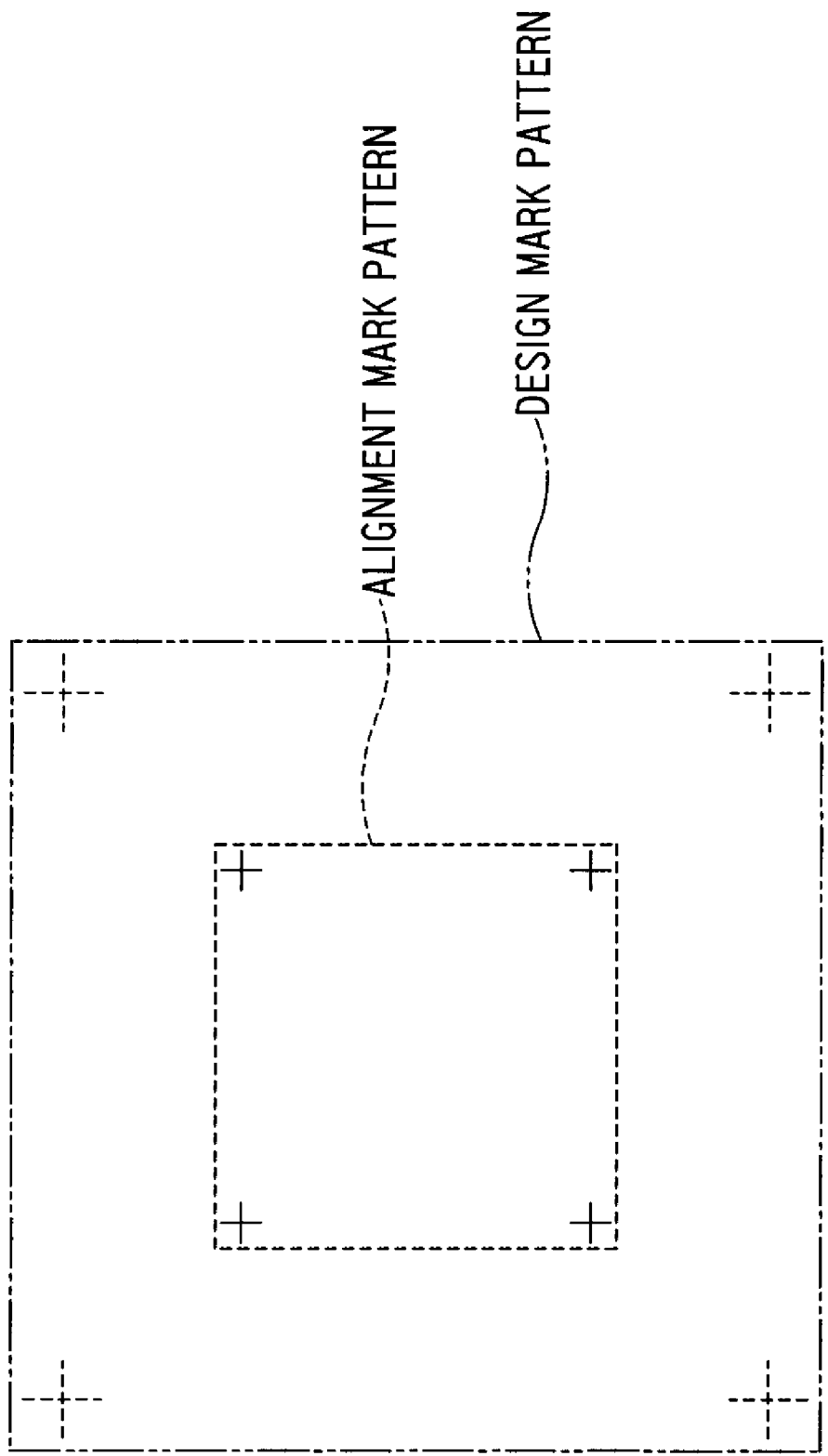
FIG. 6 is a diagrammatic illustration illustrating the relationship between the alignment mark pattern and the design mark pattern.

Alternatively, in a third modification of the embodiment of the present invention, an alignment mark may be formed as the first pattern in place of the formation of the first pattern as the primary pattern for forming a circuit pattern. In this case, an alignment mark pattern reduced with respect to an alignment mark pattern corresponding to the design data (i.e., a design mark pattern) is formed, as shown in FIG. 6.

According to the embodiment of the present invention, the first pattern reduced under the magnification correctable by the imprinter is formed, and further, the second pattern is formed in substantially the same size as that of the first pattern. Therefore, it is unnecessary to manufacture any mask or template enlarged with respect to the design pattern corresponding to the design data. As a consequence, an alignment error occurring in imprinting can be reduced, and further, the manufacture yield of the semiconductor device can be increased.

Moreover, according to the first modification of the embodiment of the present invention, the reduction is performed in the first mask/template manufacturing step (S202) illustrated in FIG. 2, thus reducing an adverse influence of the alignment error occurring in reducing the design data.

Additionally, according to the second modification of the embodiment of the present invention, the reduction is performed in the first resist pattern forming step (S203) illustrated in FIG. 2 by utilizing fine adjustability of magnification of reduction and projection of a general exposing device, thus readily implementing the first pattern forming step (S102) illustrated in FIG. 1.

In addition, according to the third modification of the embodiment of the present invention, the alignment mark is reduced more than that corresponding to the design data, so that the primary pattern formed after the formation of the alignment mark needs not be reduced, thus reducing the adverse influence of the alignment error on the primary pattern.

Alternatively, in a manufacturing process on an initial stage in the semiconductor device manufacturing process, a relatively large pattern such as a semiconductor well is frequently transferred. Therefore, even if the first pattern is formed in reduction, the rounding error of pattern size or positional caused by a grid size of a CAD or a pattern writer can be left out of consideration. That is, the formation of the first pattern reduced with respect to the design pattern corresponding to the design data in such a manner as to fall within an allowable range of the magnification correctable by the imprinter cannot adversely influence on the manufacture yield of the semiconductor device.

What is claimed is:

1. A semiconductor device manufacturing method comprising:
    forming a first resist pattern on the semiconductor substrate, and then, forming a first pattern on the semiconductor substrate by the use of the first resist pattern; and
    forming a second resist pattern on the semiconductor substrate by using an imprinter, and then, forming a second pattern on the semiconductor substrate by the use of the second resist pattern;
    wherein the forming the first pattern comprises forming the first pattern smaller than a design pattern corresponding to the design data for forming a plurality of patterns on a semiconductor substrate.

2. The manufacturing method of claim 1, wherein the forming the first pattern comprises reducing the design data to make reduced design data and using a mask or a template for forming the first pattern manufactured based on the reduced design data.

3. The manufacturing method of claim 1, wherein the forming the first pattern comprises using a reduced mask or a reduced template manufactured by reducing the mask or the template having a design pattern corresponding to the design data.

4. The manufacturing method of claim 1, wherein the forming the first pattern comprises using the mask having the design pattern corresponding to the design data and an exposing device to transfer the first pattern smaller than the design pattern onto the semiconductor substrate.

5. The manufacturing method of claim 1, wherein the forming the second pattern comprises reducing a template for use in forming the second resist pattern based on a pattern size of the first pattern.

6. The manufacturing method of claim 2, wherein the forming the second pattern comprises reducing a template for use in forming the second resist pattern based on a pattern size of the first pattern.

7. The manufacturing method of claim 3, wherein the forming the second pattern comprises reducing a template for use in forming the second resist pattern based on a pattern size of the first pattern.

8. The manufacturing method of claim 4, wherein the forming the second pattern comprises reducing a template for use in forming the second resist pattern based on a pattern size of the first pattern.

9. The manufacturing method of claim 2, wherein the forming the first pattern comprises reducing the design data within a magnification range correctable by the imprinter for use in the forming the second pattern.

10. The manufacturing method of claim 5, wherein the reducing the template comprises the reducing the template in such a manner that the second pattern has substantially the same size as that of the first pattern.

11. The manufacturing method of claim 1, wherein the forming the first pattern comprises forming the first pattern in a lower layer than the second pattern.

12. The manufacturing method of claim 1, wherein the forming the first pattern comprises the first pattern in the same layer as the second pattern.

13. The manufacturing method of claim 1, wherein the forming the first pattern comprises an alignment mark pattern reduced with respect to another alignment mark pattern corresponding to the design mark data.

14. The manufacturing method of claim 1, wherein the forming the first pattern comprises using the imprinter.

15. The manufacturing method of claim 1, wherein the first pattern is used to form a semiconductor well on the semiconductor substrate.

16. The manufacturing method of claim 1, the second pattern comprises position and size decided according to position and size of the first pattern.

* * * * *